United States Patent [19]

Greiderer

[11] Patent Number: 5,357,215
[45] Date of Patent: Oct. 18, 1994

[54] METHOD OF SETTING PHASE LOCKED LOOPS BY COMPARING OUTPUT SIGNALS IN A PHASE DETECTOR

[75] Inventor: Reinhard Greiderer, Munich, Fed. Rep. of Germany

[73] Assignee: Siemens Aktiengesellschaft, Munich, Fed. Rep. of Germany

[21] Appl. No.: 61,846

[22] Filed: May 14, 1993

[30] Foreign Application Priority Data

May 20, 1992 [DE] Fed. Rep. of Germany ....... 4216714

[51] Int. Cl.$^5$ ................ H03L 7/093; H03L 7/16; H03L 7/10; H03L 7.08
[52] U.S. Cl. ........................................ 331/16; 331/17; 331/18; 331/25; 455/260
[58] Field of Search ................ 331/15, 16, 17, 18, 331/25; 455/260

[56] References Cited

U.S. PATENT DOCUMENTS

| | | | |
|---|---|---|---|
| 5,153,530 | 10/1992 | Takagi et al. | 331/17 |
| 5,208,546 | 5/1993 | Nagaraj et al. | 331/17 X |
| 5,220,294 | 6/1993 | Ichikawa | 331/17 |

OTHER PUBLICATIONS

Publication: Mikroelektronik, vol. 41, No. 1, (1988), pp. 24–28, "C-MOS-PLL-Baustein für 900-MHz-Funkgeräte"; Krings, G. et al.

Primary Examiner—David Mis
Attorney, Agent, or Firm—Herbert L. Lerner; Laurence A. Greenberg

[57] ABSTRACT

A PLL has at least two attenuators supplying output signals, and a phase detector comparing the output signals of the at least two attenuators. The phase detector has an input and an output stage supplying an output variable being dependent on a phase difference at the input to the phase detector and being influenceable by a further electrical variable. A change in the attenuator ratios of the at least two attenuators takes place synchronously with the existing phase difference. A method for adjusting PLL parameters in the PLL includes synchronously varying the further variable determining the output variable of the phase detector, upon a change in the attenuator ratios.

3 Claims, 1 Drawing Sheet

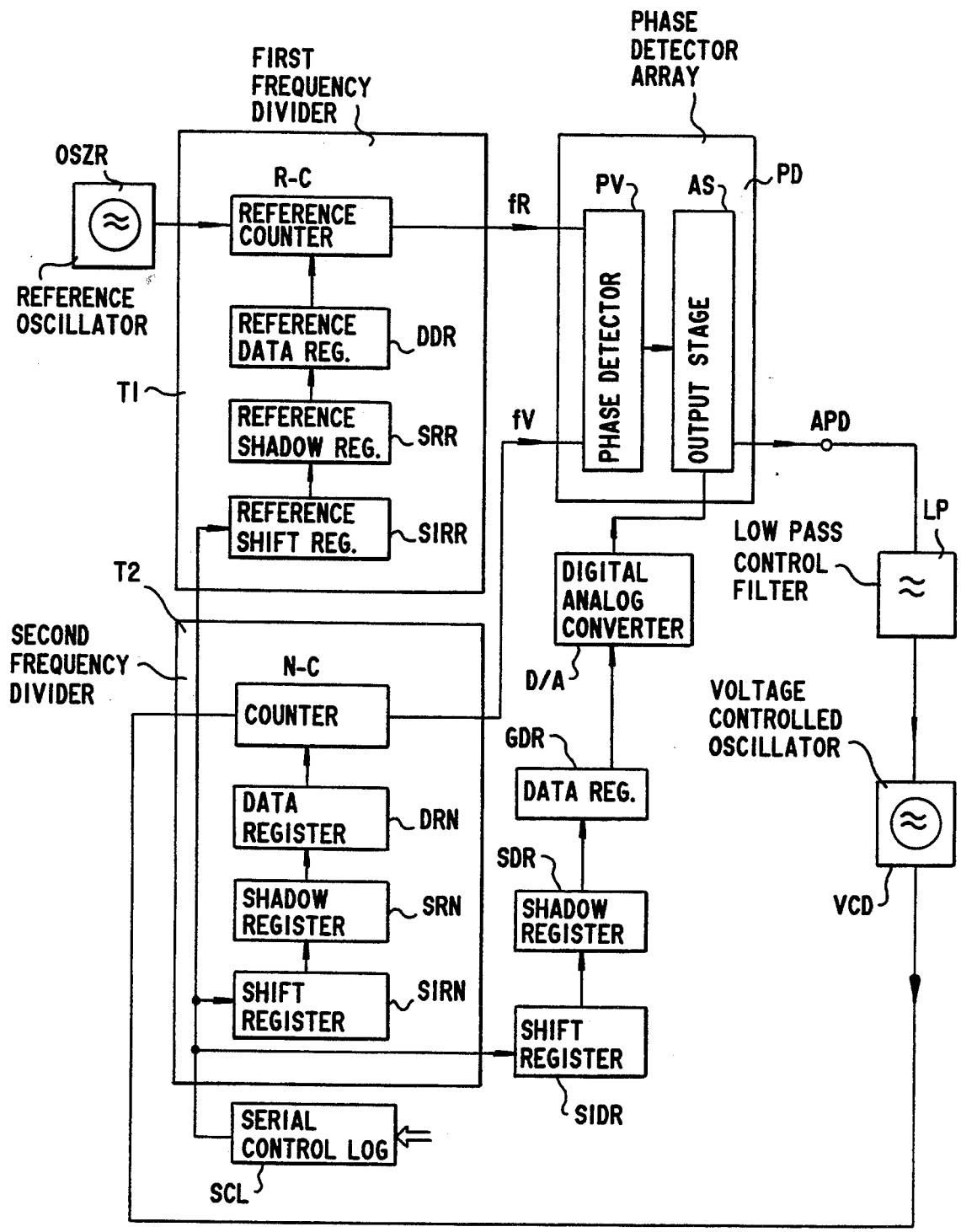

METHOD OF SETTING PHASE LOCKED LOOPS BY COMPARING OUTPUT SIGNALS IN A PHASE DETECTOR

BACKGROUND OF THE INVENTION

1. Field of the Invention

The invention relates to a method for adjusting phase locked loop variables configuration having at least two frequency dividers with output signals that are compared in a phase detector.

2. Description of the Related Art

Such configurations are known, among other sources, from an article that was translated into English under the title "New CMOS phase locked loop Component for Use in Mobile Radios in the 900 MHz Range" by G. Krings, H. U. Irmer and R. Greiderer, which is a reprint from the article entitled "Nachrichtentechnische Zeitschrift [Communications Technology Journal] (1988), Vol. 41, No. 1, pp. 24–28, and from a commercially available integrated circuit TBB 206 and a spec book of the firm Siemens entitled "ICs for Radio Equipment 1989/90", pp. 51–72, and in particular page 71 in conjunction with page 54.

Pull-in processes occur in such configurations upon the first time that they are turned on and also when the frequency is changed, or in other words upon channel changing. During these pull-in processes, the configuration does not furnish the desired signal at its output. The magnitude of the pull-out state produced by the channel change is of significance for the next pull-in process, particularly upon channel changing from a locked-on state.

In the commercial circuit TBB 206, such a problem was counteracted by so-called synchronous programming (see page 61 of the aforementioned spec book). As a result, upon program-controlled changing of the divider ratios and therefore of the output frequency of the phase locked loop, the new frequency divider ratios are set while maintaining the phase difference existing at the programming time (at the moment of change). That is attained by buffer-storing the frequency divider ratios that have been serially written in and are to be varied in so-called shadow registers, and transferring the buffer-stored frequency divider ratios, once both shadow registers have been written and the next phase comparison has been performed in the phase detector, into the applicable data register of the corresponding frequency divider simultaneously, in such a way that both frequency dividers are set to the new frequency divider ratios at the instant of the next phase comparison. Even if only the frequency divider ratio of one frequency divider is varied, the takeover of the new frequency divider ratio takes place synchronously with the existing phase difference. The frequency dividers are typically constructed as counters with a data register, which count downward to zero to the value, which is the frequency divider ratio, contained in the data register, and then are reset to the value contained in the data register. Accordingly, once the frequency divider ratios of both frequency dividers that are to be newly set are present in the applicable shadow registers, then the two counters or frequency dividers, once they have each counted to zero, are reset, since the shadow register contents are transferred to the data registers of the frequency dividers.

In that known configuration, the output variables of two frequency dividers are compared in a phase detector. The output variable of the phase detector is passed on to a loop filter through an output stage, which in that case is a current source known as a charge pump. The output variable of the output stage can additionally be varied by means of a further variable, independently of the output variable of the phase detector. In the present case, the amplitude of the output current of a current source is controllable by means of a control current of a current mirror. By exerting influence on the additional variable which affects the output signal of the phase detector, a pull-in process can be advantageously varied. The output amplitude of the phase detector is variable in the known configuration by varying a data word, so that the output signal of the phase detector can be adapted to given requirements under program control.

Nevertheless, the course of the pull-in processes upon channel changing in such known configurations is not optimal, especially if the phase locked loop has not yet locked on. It is accordingly an object of the invention to provide a method of adjusting phase locked loop variables, which overcomes the hereinafore-mentioned disadvantages of the heretofore-known methods of this general type and with which the pull-in processes, particularly upon channel changing, can be further optimized.

SUMMARY OF THE INVENTION

With the foregoing and other objects in view there is provided, in accordance with the invention, in a method for adjusting phase locked loop variables in a phase locked loop having at least two frequency dividers supplying output signals, and a phase detector comparing the output signals of the at least two frequency dividers, the phase detector having an input and having an output stage supplying an output variable being dependent on a phase difference at the input to the phase detector and being influenceable by a further electrical variable, the improvement which comprises changing frequency divider ratios of the at least two frequency dividers synchronously with an existing phase difference, and synchronously varying the further variable determining the output variable of the phase detector, upon a change in the frequency divider ratios.

In this context, synchronously means that this variable is varied as early as possible after the change in the frequency divider ratios. The goal is for the first output pulse of the phase detector that is output after the change in the frequency divider ratios to be already varied with the changed further variable.

In accordance with another mode of the invention, a current source is provided as the output stage of the phase detector; the phase difference at the input to the phase detector determines the pulse length of the output current of this current source, and the amplitude of the output current of this current source is adjustable as a function of a control variable.

In accordance with a concomitant mode of the invention, this control variable for adjusting the current amplitude can be produced by digital/analog conversion of a data word, in one embodiment of a phase locked loop configuration.

If a current mirror circuit is used, a control current may be provided as the control variable, or as the further variable that varies the output signal of the phase detector.

Other features which are considered as characteristic for the invention are set forth in the appended claims.

Although the invention is illustrated and described herein as embodied in a method of adjusting phase locked loop variables, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawing.

BRIEF DESCRIPTION OF THE DRAWINGS

The single FIGURE of the drawing is a block circuit diagram which is used below to explain the method according to the invention.

DESCRIPTION OF THE PREFERRED EMBODIMENTS

Referring now to the single FIGURE of the drawing in detail, there is seen a simplified illustration of a phase locked loop, including a reference oscillator OSZR which furnishes a reference signal, and a voltage-controlled oscillator VCO having a frequency that is controllable as a function of voltage. An output signal of the reference oscillator serves as an input signal of a first frequency divider circuit T1, which in the embodiment shown includes a reference counter R-C that counts downward from a predetermined value to zero, and a data register DDR which stores the corresponding frequency divider frequency from which the reference counter counts downward and which is read by the counter each time it reaches zero. The data register DDR is loaded from a shadow register SRR, which in turn can be loaded in clock-controlled fashion from a shift register SIRR. An output of the reference counter R-C and thus an output of the frequency divider T1, furnish a frequency fR which depends on the reference frequency of the oscillator OSZR and on the programmed frequency divider frequency. A second frequency divider T2 likewise includes a counter N-C and a corresponding data register DRN, a shadow register SRN and a shift register SIRN. An input of the counter N-C is acted upon by an output signal of the oscillator VCO, and an output of the counter N-C furnishes a signal fV which depends on the output signal of the oscillator VCO.

The configuration includes a serial control logic SCL, which can receive data from a non-illustrated processor unit, through a serial bus. The serial control logic SCL assigns these data to the corresponding shift register SIRR or SIRN and optionally to other shift registers. The outputs of the frequency dividers T1 and T2 are connected to corresponding inputs of a phase detector array PD, which includes a phase detector PV and an output stage AS. The phase detector PV furnishes a logic level at its output that depends on the signals fR and fV which are present at its inputs, and the amplitude of this level is variable and is connected through a control input of the output stage AS. In the illustrated exemplary embodiment, the output stage AS is triggered by a data register GDR through a digital-/analog conversion D/A. A signal furnished at an output APD of the phase detector array PD is accordingly dependent both on the signals fR and fV and on the contents of the data register GDR. The signal present at the output APD of the phase detector array PD is carried through a control filter LP to the oscillator VCO as a control variable. The data register GDR is programmable by the serial control logic SCL, through a shift register SIDR and a shadow register SDR following the shift register SIDR.

If the serial control logic SCL receives new frequency divider ratios and a new control variable for the output stage AS of the phase detector array PD, then it writes them successively into the shift registers SIRR, SIRN and into the shift register SIDR. The contents of the shift register SIRR are transferred to the shadow register SRR; the contents of the shift register SIRN are transferred to the shadow register SRN; and the contents of the shift register SIDR are transferred to the shadow register SDR. Once all of the shadow registers have been programmed, and once the counter N-C of the second frequency divider T2 has counted to zero and has extracted the still unvaried frequency divider frequency from the data register, the contents of the shadow register SRN of the frequency divider T2 are transferred to the data register DRN. Moreover, from the moment mentioned, as soon as the counter R-C of the first frequency divider T1 has counted to zero and has taken over the as-yet unvaried frequency divider frequency from the data register DDR, the contents of the shadow register SRR are transferred to the data register DDR. The contents of the shadow register SDR are transferred to the data register GDR no sooner than after the counter R-C had counted to zero in this cycle and no later than before the counter N-C counts to zero again, so that upon the next phase comparison that takes place, a new value for the variable that determines the amplitude of the output signal at the output APD of the phase detector array PD is effective. As a result, a synchronous variation of the variable that is influenced by the contents of the data register GDR is brought about in such a way that once the change in the frequency divider ratios has occurred, this variable has been varied so promptly that upon the detection of the next phase difference by the phase detector PV, the new value will have been set.

The output stage AS of the phase detector array PD may be a current source. In that case, a pulse length of an output current of the current source AS is determined from the phase difference at the input to the phase detector array PD, and an amplitude of the output current of the current source AS is adjusted as a function of a control variable.

I claim:

1. In a method for adjusting phase lock loop variables in a phase lock loop having at least two frequency dividers supplying respective output signals, and a phase detector comparing the output signals of the at least two frequency dividers, the phase detector having an input and having an output stage supplying an output variable voltage being dependent on a phase difference at the input to the phase detector and being influenced by a further electrical variable, the improvement which comprises asynchronously setting the shadow registers, changing the frequency divider ratios of the at least two frequency dividers to change the existing phase difference, synchronously varying with the shadow registers the further variable, and determining the output variable voltage of the phase detector upon a change in the frequency divider ratios.

2. The method according to claim 1, which further comprises providing with a current source of the output stage of the phase detector an output current pulse, determining a pulse length of the output current of the current source from the phase difference at the input to the phase detector, and adjusting an amplitude of the output current of the current source as a function of a control variable voltage applied to an input of the phase detector.

3. The method according to claim 2, which further comprises generating the control variable voltage for setting the current amplitude by digital/analog conversion of a data word supplied to an input of said frequency dividers.

* * * * *